(12) United States Patent
Aulnette et al.

(10) Patent No.: US 7,544,976 B2
(45) Date of Patent: Jun. 9, 2009

(54) SEMICONDUCTOR HETEROSTRUCTURE

(75) Inventors: Cécile Aulnette, Grenoble (FR); Christophe Figuet, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 163 days.

(21) Appl. No.: 11/672,663

(22) Filed: Feb. 8, 2007

(65) Prior Publication Data
US 2008/0142844 A1 Jun. 19, 2008

(30) Foreign Application Priority Data
Dec. 15, 2006 (EP) .................... 06291955

(51) Int. Cl.
*H01L 31/00* (2006.01)
(52) U.S. Cl. .............. 257/190; 257/E29.193; 257/E21.086
(58) Field of Classification Search ........ 257/19, 257/55, 63, E21.086, 190, E29.193
See application file for complete search history.

(56) References Cited

U.S. PATENT DOCUMENTS

| | | | |
|---|---|---|---|
| 6,403,976 B1 | 6/2002 | Saitoh et al. | 257/19 |
| 2003/0107032 A1* | 6/2003 | Yoshida | 257/19 |
| 2005/0167002 A1* | 8/2005 | Ghyselen et al. | 148/33 |
| 2006/0022200 A1 | 2/2006 | Shiono et al. | 257/65 |
| 2008/0142844 A1* | 6/2008 | Aulnette et al. | 257/191 |

FOREIGN PATENT DOCUMENTS

| | | |
|---|---|---|
| EP | 1 020 898 | 7/2000 |
| EP | 1 566 832 | 8/2005 |
| WO | WO 2004/019391 | 3/2004 |

OTHER PUBLICATIONS

G. Abstreiter, "Semiconductor Heterostructures", 8173 Siemens Forschungs—und Entwicklungsberichte, vol. 15, No. 6, pp. 312-318 (1986).

* cited by examiner

*Primary Examiner*—Evan Pert
*Assistant Examiner*—Scott R Wilson
(74) *Attorney, Agent, or Firm*—Winston & Strawn LLP

(57) ABSTRACT

A semiconductor heterostructure that includes a support substrate with a first in-plane lattice parameter, a buffer structure formed on the support substrate and having on top in a relaxed state a second in-plane lattice parameter, and a multi-layer stack of ungraded layers formed on the buffer structure. This semiconductor hetero-structure possess a lower surface roughness than other heterostructures. In the heterostructure, the ungraded layers are strained layers that comprise at least one strained smoothing layer of a semiconductor material having in a relaxed state a third in-plane lattice parameter which has a value between the first and the second lattice parameter.

19 Claims, 7 Drawing Sheets

SEMICONDUCTOR HETEROSTRUCTURE

BACKGROUND ART

Figure 1:
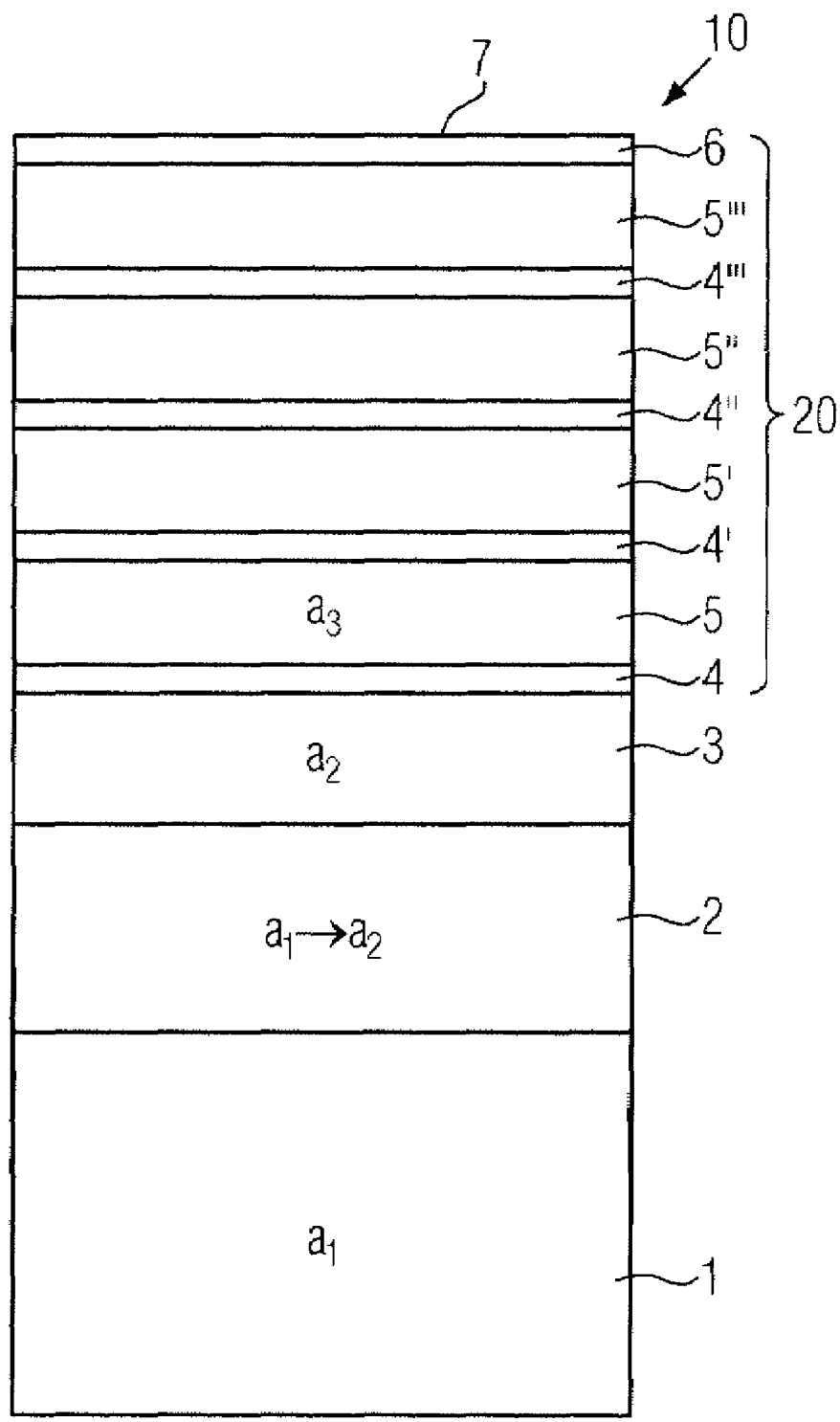

The present invention relates to a semiconductor hetero-structure comprising a support substrate with a first in-plane lattice parameter, a buffer structure formed on the support substrate and having on top in a relaxed state a second in-plane lattice parameter, and a multi-layer stack of ungraded layers formed on the buffer structure.

Such heterostructures are used for wafer recycling of a donor wafer after taking off or transferring a useful layer of a semiconductor material and are known from US patent application 2005/0167002 A1. This document describes, for example, a wafer structure such as donor wafer 16 shown in FIG. 7, that includes a silicon support substrate 1 on which a graded SiGe buffer layer 2 with a progressively increasing germanium content is formed, wherein a multi-layer structure of alternating relaxed SiGe layers 3, 3' and strained silicon layers 4, 8 is formed on the buffer layer 2.

The buffer layer 2 functions to adapt the lattice parameters $a_1$ and $a_2$ between the crystallographic structures of the support substrate 1 and the layers of the multi-layer stack and to reduce thereby the density of defects in the upper multi-layer structure. To perform this function, the buffer layer 2 has at its interface with the support substrate 1 a lattice parameter that is almost identical to the lattice parameter $a_1$ of the support substrate 1, and has at its interface with the multi-layer stack a lattice parameter that is almost identical to the lattice parameter $a_2$ of the layer 3 of the multi-layer stack directly adjacent to the buffer layer 2.

The thickness of the buffer layer 2 is chosen to be between 1 and 3 micrometers for surface concentrations of Ge of less than 30% to obtain a good structural relaxation at the surface, and to confine defects related to the difference in the lattice parameters. The relaxed SiGe layer 3 is formed with a uniform concentration of Ge that is almost identical to the Ge concentration of the buffer layer 2, such as about 20%, and has a typical thickness of about 0.5 to 1 micrometers.

The strained silicon layer 4 which is formed on the relaxed SiGe layer 3 must not exceed a critical thickness for relaxation. For the layer 4 made of strained Si inserted between two layers of relaxed SiGe with a concentration of Ge of about 20%, the critical thickness is of the order of about 20 nanometers.

The multi-layer stack used has a sufficient thickness to form at least two useful layers, such as the strained silicon layers 4, 8, that can be detached and additional material can be removed to planarize exposed surfaces of the useful layers prior to detachment from the donor wafer. In accordance with an example described in US patent application 2005/0167002 A1, the useful layers can be detached from the donor wafer by means of the so-called SMART-CUT® technique including forming of a weakening area in the donor wafer by implantation, bonding the donor wafer with a receiving wafer and subjecting the bonded wafer pair to a thermal and/or mechanical treatment, or a treatment with any other type of energy input, to detach it at the weakening area.

Although the principle of the process described in the document US patent application 2005/0167002 A1 is well suited for layer detachment and wafer recycling, it may require multiple polishing steps to provide sufficient low roughness of top layer. Indeed, it has been shown that, with a reduced number of polishing steps, the roughness of the surface 9 of the top layer 8 of the donor wafer 16 is in a region between 7 and 10 Å RMS on a 2×2 µm scan so that the known donor wafer structures are not suitable for direct wafer bonding which is important for the SMART-CUT® process. Accordingly, there is a need for semiconductor hetero-structures of the above-mentioned type that have lower surface roughness values.

SUMMARY OF THE INVENTION

The present invention relates to a semiconductor heterostructure comprising a support substrate with a first in-plane lattice parameter, a buffer structure formed on the support substrate and having on top in a relaxed state a second in-plane lattice parameter, and a multi-layer stack of ungraded layers formed on the buffer structure. To provide lower surface roughness values, the ungraded layers are strained layers comprising at least one strained smoothing layer of a semiconductor material having in a relaxed state a third in-plane lattice parameter which has a value between that of the first and the second lattice parameters.

It is the surprising finding of this invention that direct bonding between a donor wafer composed of the semiconductor heterostructure of the present invention and a receiving wafer can be applied without difficulties by providing the at least one strained smoothing layer in the multi-layer stack. By this arrangement, not only the surface roughness of the ungraded smoothing layer is reduced compared to the surface roughness of the underlying buffer structure, but also the layer of the multi-layer stack formed above the smoothing layer benefit therefrom and show also a reduced surface roughness. As a consequence, the surface roughness on top of the semiconductor heterostructure is reduced in comparison with state of the art heterostructures and bonding is facilitated. This is due to the fact that the layers of the multi-layer stack which are formed on the smoothing layer grow on a strained but smooth surface of the underlying smoothing layer.

BRIEF DESCRIPTION OF THE DRAWING FIGURES

Figure 2:
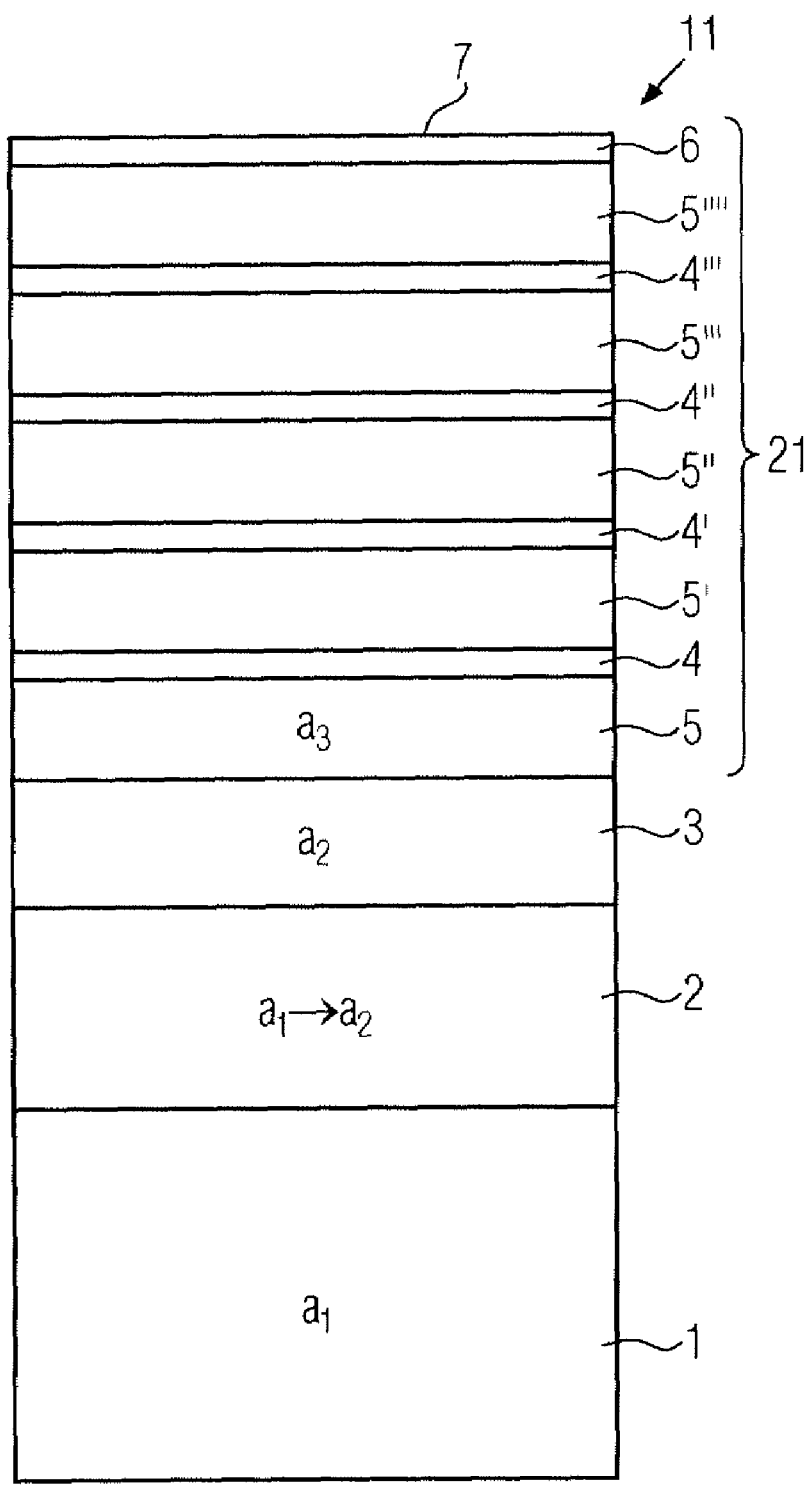
Figure 3:
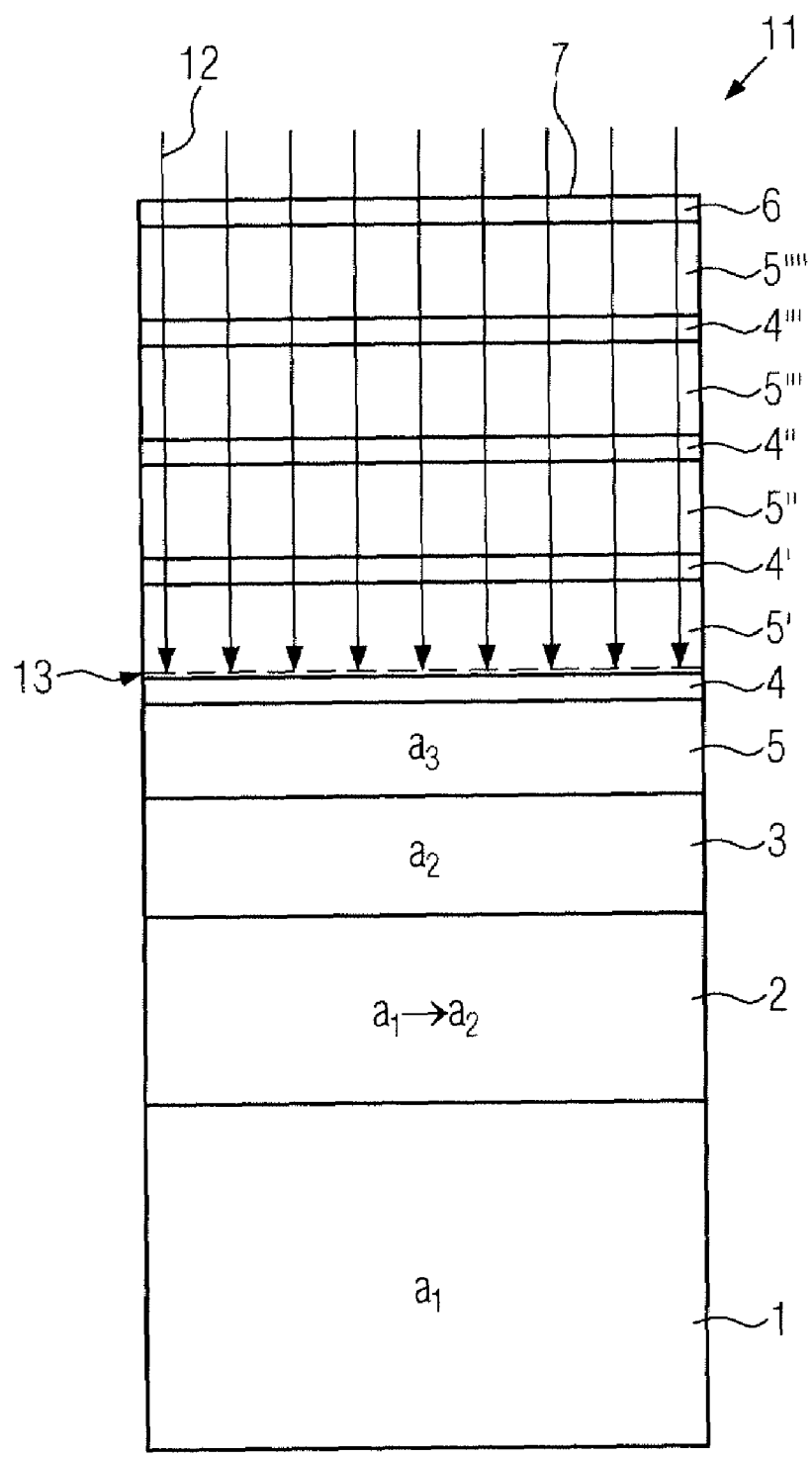
Figure 4:
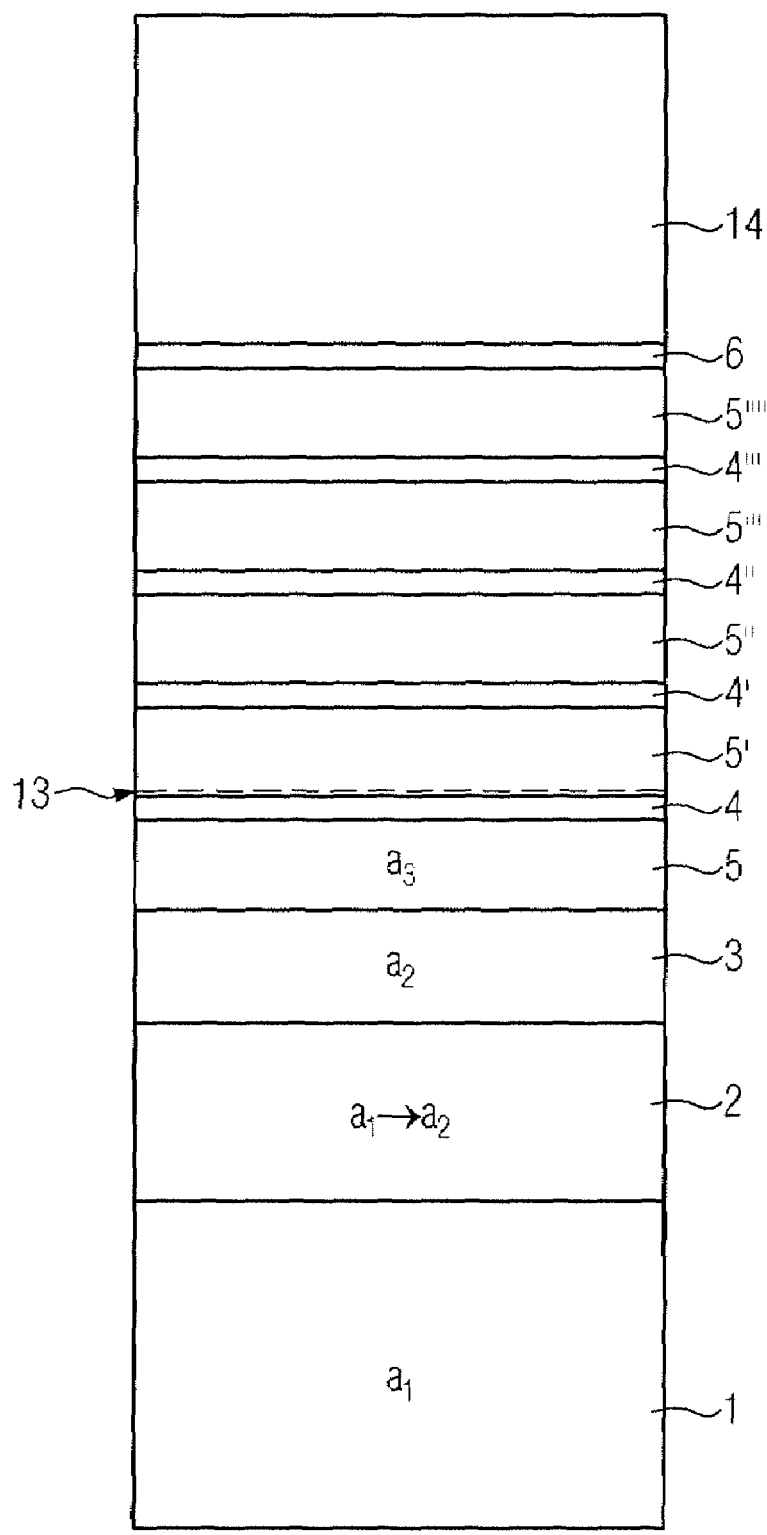
Figure 5:
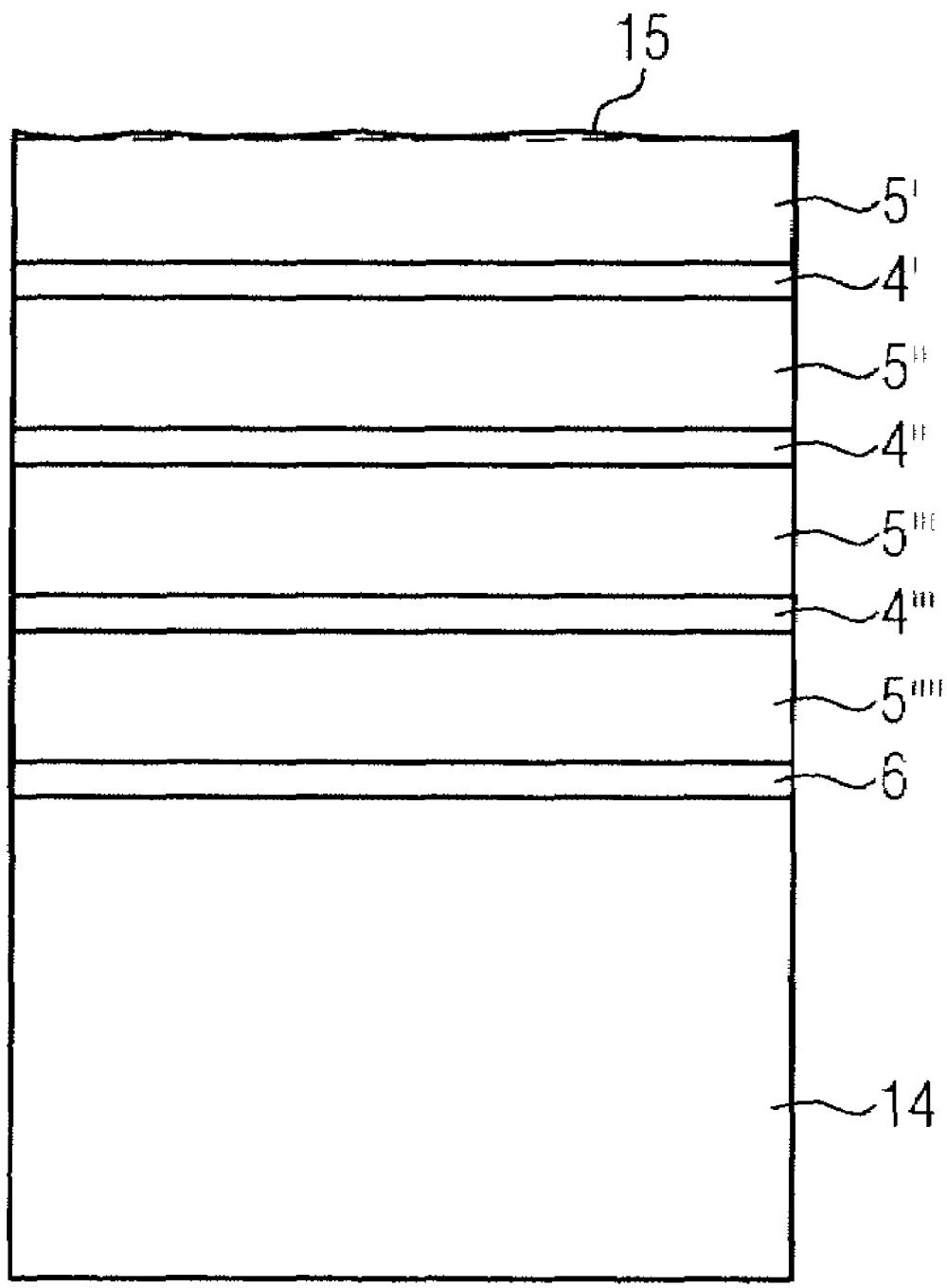
Figure 6:
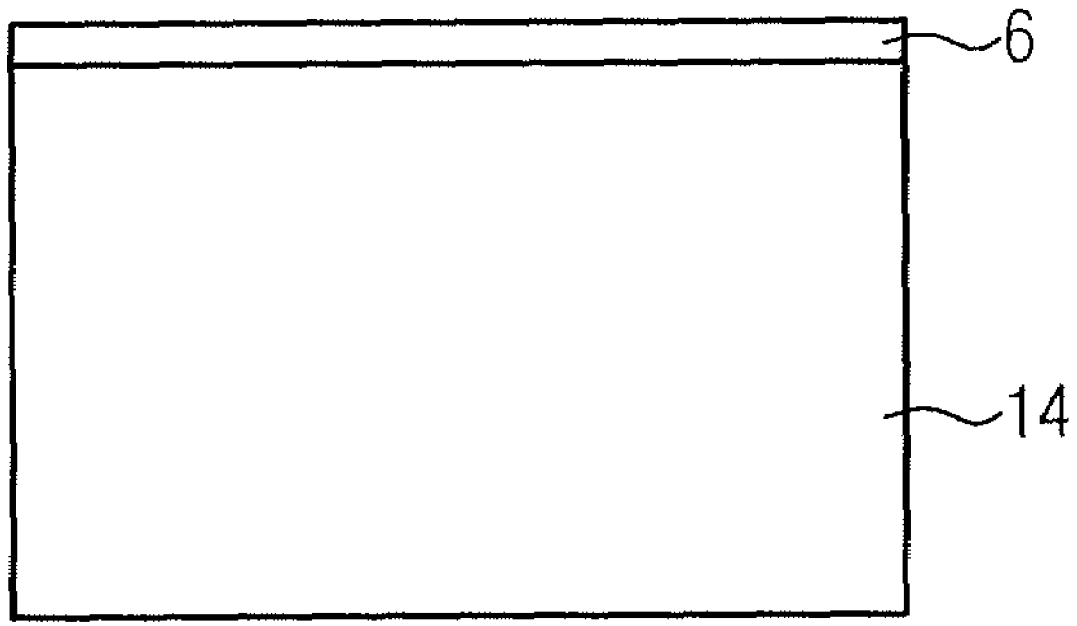
Figure 7:
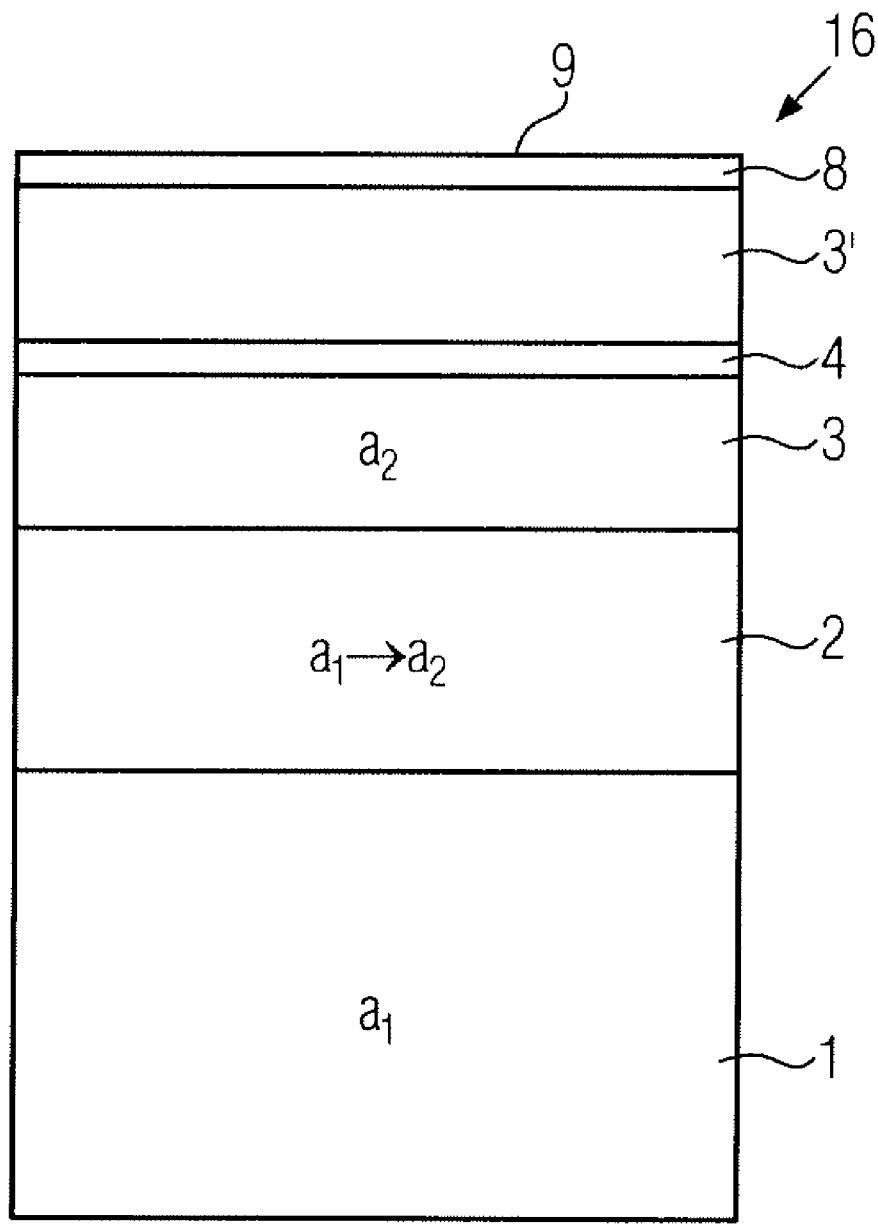

In the following, the present invention and its advantages are explained in conjunction with the appended by drawing figures wherein:

FIG. 1 shows schematically an exemplary embodiment of the invention,

FIG. 2 shows schematically another exemplary embodiment of the present invention, FIG. 3 shows schematically the embodiment of FIG. 2 during an implantation step, FIG. 4 shows schematically the embodiment of FIG. 3 after a bonding step with a handle wafer, FIG. 5 shows schematically a split part of the embodiment of FIG. 4 after a splitting step, FIG. 6 shows schematically the embodiment of FIG. 5 after removal of the smoothing layers, and FIG. 7 shows schematically a semiconductor heterostructure used in the prior art.

DETAILED DESCRIPTION OF THE PREFERRED EMBODIMENTS

In this context, the term "in-plane lattice parameter" corresponds to a lattice parameter of the various layers in a direction essentially parallel to the interfaces between the various layers and to lattice parameters which the layers would show in an relaxed state. It is, in fact, known that the lattice parameter depends on the material used, but also on the nature of the underlying material on which it is deposited. To be able to compare lattice parameter values of different layers in the following, it is always referred to values as if the layers were in a relaxed state, and not in the strained state under heteroepitaxial conditions, which is also known under the terms pseudomorphic or commensurate growth. As an interface may be characterized by two lattice parameters, the above-mentioned condition can either be satisfied for both lattice parameters or for only one. In addition, the top layer of the heterostructure is not necessarily the final layer, further layers strained or relaxed can be provided thereon.

According to an advantageous embodiment of the present invention, the buffer structure comprises an at least spatially graded buffer layer formed on the support substrate. The spatially graded buffer layer is used to adapt gradually or step by step the lattice parameter between the underlying support substrate and the deposited material of the multi-layer stack, while trying to minimize the density of defects.

In a preferred example of the invention, the buffer structure comprises a relaxed layer formed on the graded buffer layer. The ungraded relaxed layer on top of the graded buffer layer helps to improve the crystalline quality of the layers of the multi-layer stack formed on the relaxed layer.

It is furthermore advantageous if the relaxed layer is a relaxed SiGe layer which is formed on a graded SiGe buffer layer and has a germanium content corresponding to the highest germanium content of the graded SiGe buffer layer. The ungraded relaxed layer of SiGe with constant Ge concentration corresponding to the Ge concentration obtained on top of the graded buffer layer is especially well suited to enhance the crystalline quality of the resulting semiconductor heterostructure.

Preferably, the buffer structure is a graded SiGe buffer layer with an increasing germanium content, and the multi-layer stack consists of alternating SiGe layers, the SiGe layers having a germanium content between 0% and a percentage being less than the highest germanium content of the graded SiGe buffer layer. This heterostructure can provide strained SiGe and/or Si layers with a very low surface roughness for a transfer onto a receiving or handle wafer.

In particular, the multi-layer stack includes alternating SiGe smoothing layers and strained silicon layers. In this structure, the SiGe smoothing layers make sure that in the strained silicon layers formed thereon have a very good crystallinity and, therefore, a very low surface roughness.

In another preferred configuration of the invention, the multi-layer stack has on top a strained silicon layer. This strained silicon layer has such a low surface roughness that it can be bonded directly without further surface planarization step with another wafer such as a handle or receiving wafer. This is especially advantageous since strained silicon layers have a very low thickness and are therefore not suitable for further surface planarization steps.

The multi-layer stack may include a first strained silicon layer being formed on the relaxed SiGe layer, wherein the other layers of the multi-layer stack are formed on the first strained silicon layer. In this structure, the first strained silicon layer can provide a defined strained base for the growth of the next strained layers of the multi-layer stack including the strained smoothing layer.

In another embodiment of the invention, the multi-layer stack comprises a first SiGe smoothing layer being formed on the relaxed SiGe layer and under the first strained silicon layer, wherein the other layers of the multi-layer stack are formed on the first SiGe smoothing layer. This has the advantage that the first strained silicon layer and the other layers of the multi-layer stack formed thereon can be grown on the smoothed subsurface of the smoothing layer and have therefore excellent surface properties.

According to a further embodiment of the invention, the highest germanium content of the graded SiGe buffer layer is about 20% and the SiGe smoothing layers have a germanium content of about 11 to about 19.5%. In this structure, the surface roughness of the top layer of the structure can be reduced to a value below 1 Å RMS in a 2×2 µm scan.

Particularly, each of the SiGe smoothing layers of the multi-layer stack has a thickness of about 200 Å to about 600 Å. Smoothing layers having a thickness in this region provide especially stable conditions for the formation of strained layers with a very low surface roughness.

Preferentially, each of the strained silicon layers of the multi-layer stack has a thickness of about 50 Å to about 250 Å. A thickness in this region is low enough to be under the thickness for relaxation but is high enough to ensure a good transfer of the strained silicon layer onto a handle or receiving wafer.

According to a variation of the invention, the highest germanium content of the graded SiGe buffer layer is about 40%. This buffer layer is especially well suited to form a multi-layer stack with high strained layers on the buffer layer. These high-strained layers show very good electronic properties.

The invention is especially well applicable if the support substrate comprises silicon, sapphire, SiC or AsGa, and the buffer structure is formed of an atomic alloy belonging to one atomic alloy Group V-V, Group III-V, or Group II-VI. Based on these materials, the present invention can lead to a large variety of semiconductor heterostructures having all excellent surface characteristics.

Preferably, the ungraded layers of the multi-layer stack comprise Si, Ge, SiGe, AsGa, InP, InGaAs, AlN, InN and/or GaN. Since these semiconductor materials can be transferred with the present invention onto another wafer without difficulties during bonding, very efficient transfer technologies with high-quality products can be provided.

Referring now to the drawings, FIG. 1 shows schematically an exemplary semiconductor heterostructure 10 according to an embodiment of the present invention. The heterostructure 10 includes of a support substrate 1, a buffer structure of a buffer layer 2 and a relaxed layer 3 and a multi layer-stack 20 formed thereon.

In the example shown in FIG. 1, the support substrate 1 is a silicon wafer. In other embodiments of the invention, the support substrate 1 can include materials like sapphire, SiC or AsGa. It is furthermore possible that only an upper part of the support substrate be of silicon, sapphire, SiC or AsGa. The support substrate 1 has at least in a region at its interface with the buffer structure an in-plane lattice parameter $a_1$.

The buffer layer 2 is in FIG. 1 an at least spatially graded $Si_{1-x}Ge_x$ buffer layer with a progressively increasing germanium content and has on top in a relaxed state a second in-plane lattice parameter $a_2$. The $Si_{1-x}Ge_x$ buffer layer (SiGe buffer layer) is preferably epitaxially grown on the silicon support substrate 1. In the shown example, the buffer layer 2 consists of the two compounds: silicon and germanium the concentration of which changes over the thickness of the buffer layer 2. By doing so, the lattice parameter in the graded buffer 2 slowly changes. For example, one can start with x=0 at the interface towards the silicon substrate 1, so that the lattice parameter corresponds to the one of the underlying silicon substrate 1. Then, the germanium concentration can grow until approximately 20%, thereby the in-plane lattice parameter becomes larger. It should be noted, however, that the final germanium concentration can be freely chosen, for instance 30% or 40%, and could even reach 100%.

The growth of the buffer layer 2 can be achieved using state of the art techniques, for example chemical vapor deposition in an epitaxial equipment using standard process conditions. Suitable precursor gases for the deposition of silicon germanium include, for example, $SiH_4$, $Si_3H_8$, $Si_2H_6$, DCS or TCS and $GeH_4$, $GeH_3Cl$, $GeH_2Cl_2$, $GeHCl_3$ or $GeCl_4$ together with $H_2$ as a carrier gas. Depending on the precursor gases and their decomposition temperature the deposition temperature is chosen, as can be seen from Table 1, which represents some possible examples suitable for the growth of $Si_{1-xa2}Ge_{xa2}$ with a germanium content of up to about 20%. The composition gradient is achieved by adapting the amount of the Si and/or Ge precursor. Alternatively the deposition could be carried out by molecular beam epitaxy.

TABLE 1

| Si precursor | Ge precursor | deposition temperature |
| --- | --- | --- |
| $SiH_4$ | $GeH_4$ | 800° C.-900° C. |
| $SiH_2Cl_2$ | $GeH_4$ | 800° C.-950° C. |
| $SiH_2Cl_2$ | $GeCl_4$ | 1000° C.-1100° C. |
| $SiHCl_3$ | $GeCl_4$ | 1050° C.-1150° C. |

In a subsequent step, which is not explicitly illustrated in the figures, a surface treatment is carried out which comprises chemical mechanical polishing (CMP) to obtain a surface on the graded $Si_{1-xa2}Ge_{xa2}$ buffer layer 2 or on the subsequent layer 3 having a roughness of about 1.3 Å RMS, obtained for a scan window of 2 μm*2 μm. Then the achieved structure undergoes a bake step, e.g. is emerged in hydrofluoric acid HF and heated in hydrogen $H_2$ for about three minutes in a temperature range of about 800 to 850° C. This step is used to remove oxide from the surface of the buffer layer 2, but the bake step leads to an increased surface roughness of about 2.6 Å RMS.

The buffer layer 2 has the function to adapt the lattice parameters $a_1$ and $a_2$ between the crystallographic structures of the support substrate 1 and the layers of the semiconductor structure overlying the buffer layer 2 to reduce thereby the density of defects in the upper multi-layer structure. To perform this function, the buffer layer 2 has at its interface with the support substrate 1 a lattice parameter almost identical to the lattice parameter $a_1$ of the support substrate 1, and has at its interface with the multi-layer stack a lattice parameter almost identical to the lattice parameter $a_2$ of the relaxed layer 3 directly adjacent to the buffer layer 2.

In another variant of the invention, the buffer layer 2 can consist of $Al_xGa_{1-x}N$ with x varying from 0 to 1 starting from the interface with the support substrate 1. In further embodiments of the present invention, the buffer layer 2 can be an ungraded layer and/or can comprise Si or Ge or can be formed of an atomic alloy belonging to one atomic alloy Group V-V, Group III-V, or Group II-VI, such as GaAs, InP, InGaAs, AlN, InN, or GaN.

In FIG. 1, the relaxed layer 3 is a relaxed SiGe layer 3 and has a germanium content corresponding to the highest germanium content of the underlying graded SiGe buffer layer 2. In the embodiment shown, the Ge content is about 20%. In other embodiments of the invention, the Ge concentration of the relaxed SiGe layer 3 can be different from this percentage. In yet another embodiment of the invention, the relaxed layer 3 can be omitted, so that the multi-layer stack 20 is directly formed on the buffer layer 2.

In the embodiment of FIG. 1, a strained silicon layer 4 is formed on the relaxed layer 3. Instead of a strained silicon layer any other ungraded and strained SiGe layer can be formed on the relaxed layer 2.

Instead of SiGe or Si, the ungraded layers of the multi-layer stack 20 can comprise Si, Ge, SiGe, SiGeC, AsGa, InP, InGaAs, AlN, InN and/or GaN.

With reference to FIG. 1, a strained ungraded SiGe smoothing layer 5 is formed on the strained silicon layer 4. The strained smoothing layer 5 comprises such a concentration of Ge that the smoothing layer 5 would have in a relaxed state a third in-plane lattice parameter $a_3$ which is between the first lattice parameter $a_1$ of the support substrate 1 and the second lattice parameter $a_2$ on top of the buffer layer 2.

This smoothing layer 5 is grown with a constant composition of the same compounds silicon and germanium, but with a composition $Si_{1-xa3}Ge_{xa3}$ different to the composition of the final layer on top of the buffer layer 2. Having the same compounds, essentially the same growth conditions can be chosen, except for the amount of precursor gas provided for each compound. The total thickness of the smoothing layer 5 and all further layers that are not lattice matched with the buffer layer 2 should be less than a critical thickness, to prevent the nucleation of dislocations or other defects which would occur above this thickness. The value of the critical thickness depends on the difference in Ge concentration between the buffer layer 2 and the smoothing layer 5, and also depends on deposition conditions. Best results have been achieved for thicknesses of less than 1000 Å, in particular for a thickness in a range of about 200 Å to 600 Å, more in particular of about 400 Å for the smoothing layer 5. The composition of the smoothing layer 5 is chosen such that the in-plane lattice parameter $a_3$ of that layer 5 is smaller than the in-plane lattice parameter $a_2$ of the final layer of the buffer layer 2. With the germanium composition of 20% on top of the buffer layer 2, in this example, suitable percentages for the smoothing layer 5 are of 11 to 19.5%, in particular 17.5% of germanium. For 40% Ge in the buffer layer 2, Ge concentration in the smoothing layer 5 is between 35% and 39.5%.

The multi-layer stack 20 of FIG. 1 includes alternating SiGe layers, the SiGe layers having a germanium content between 0% and a percentage being less than the highest germanium content of the graded SiGe buffer layer 2. In particular, the multi-layer stack 20 includes alternating strained SiGe layers 5, 5', 5'', 5''' and strained silicon layers 4, 4', 4'', 4''', 6.

In the embodiment shown, the highest germanium content of the graded SiGe buffer layer 2 is about 20% and the SiGe smoothing layers 5, 5', 5'', 5''' have a germanium content of about 11 to about 19%. Each of the SiGe smoothing layers 5, 5', 5'', 5''' of the multi-layer stack 20 has a thickness of about 200 Å to about 600 Å; each of the strained silicon layers 4, 4'', 4''', 6 of the multi-layer stack 20 has a thickness of about 50 Å to about 250 Å; and the multi-layer stack 20 has a thickness of about 1000 Å to about 3400 Å. In the particular example, the smoothing SiGe layers 5, 5', 5'', 5''' of the multi-layer stack 20 have thickness of about 400 Å, the strained silicon layers 4, 4'', 4''', 6 have a thickness of about 200 Å and the whole multi-layer stack 20 has a thickness of about 2600 Å.

It should be noted that already the buried interface between the smoothing layer 5 and the strained silicon layer 4' in FIG. 1 has already a roughness of less than 2.5 Å RMS, in particular less than 2.0 Å RMS, even more in particular of less than 1.8 Å RMS.

The strained silicon layer 6 on top of the multi-layer structure 20 has a very low roughness of its surface 7. In the example shown, the surface roughness of the semiconductor heterostructure 10 is below 1 Å in a 2 μm×2 μm scan. According to a further variant, a germanium, a Ge, $Si_{1-y}Ge_y$ or an SiGeC layer may be grown as a top layer, instead of the strained silicon layer 6.

According to another embodiment of the inventive method of manufacturing a semiconductor heterostructure, during the growth of the ungraded smoothing layer 5 a growth temperature is used which is lower than the growth temperature used during formation of the buffer layer 2. The growth temperature for the ungraded $Si_{1-x}Ge_x$ layer 5 is chosen to be about 50° C. to about 500° C. lower than the growth temperature of the graded buffer layer 3. During growth of the buffer lower 2 one typically looks for a high deposition temperature to ensure high growth rates but by choosing a lower growth temperature for the ungraded layer 5, even though growth speed will lower, it is possible to preferably deposit material in the valleys of the surface of the $Si_{1-x}Ge_x$ buffer layer 2 rather than on the peak. As a consequence a smoothing effect occurs. This effect adds to the already advantageous effect of having a smaller in-plane lattice parameter applied in the first embodiment. Thus, a further improved smoothing of the semiconductor heterostructure 10 and thus also of the top layer 7, here the strained silicon layer 6, will occur.

Indeed, when the growth temperature is high, the total thermal energy of the arriving atoms is high and the surface energy, which is the energy of the surface on which the atoms are deposited, becomes negligible, so that it cannot have a positive impact on smoothening. If, however, the thermal energy is relatively low, like here, the surface energy can have a positive impact, as by depositing atoms into the valleys, the overall surface becomes smaller and an energy gain is observed. Thus, in this case a smoothing of the surface will occur. If, however, the temperature is too low, the thermal energy will not be sufficient for the arriving atoms to move to the preferred nucleation sites in the valleys to reduce the surface energy.

By using this variant of the invention, the surface roughness properties are even better both at the buried interface and on the surface 7 of the top layer 6. For a strained silicon layer 6 with a thickness of about 200 Å, surface roughness values of less than 1.15 Å RMS has been achieved with a post-bake roughness of the buffer layer 2 being of the order of about 2.6 Å RMS. Also the buried interface between the ungraded layer 5 and the strained silicon layer 6 has improved roughness values of less than 1.8 Å RMS, and as low as 1 Å RMS.

The advantageous temperature range actually used depends on the material of the layer, e.g. for a $Si_{1-x}Ge_x$ layer on the germanium content, the precursor gases used, and the layer thickness. Table 2 illustrates the preferred temperature range for the smoothing layer 5 as a function of the germanium percentage in $Si_{1-x}Ge_x$.

TABLE 2

| layer material | typical growth temperature buffer layer 2 [° C.] | growth temperature ungraded layer 5 [° C.] |
| --- | --- | --- |
| $Si_{1-x}Ge_x$, x∈[0, 20] | 800-900 | 650-750 |
| $Si_{1-x}Ge_x$, x∈[20, 40] | 750-850 | 600-700 |
| $Si_{1-x}Ge_x$, x∈[40, 60] | 700-800 | 550-650 |
| $Si_{1-x}Ge_x$, x∈[60, 80] | 650-750 | 500-600 |
| $Si_{1-x}Ge_x$, x∈[80, 90] | 600-700 | <600 |
| $Si_{1-x}Ge_x$, x∈[90, 100] | 550-650 | <550 |

For CVD layer deposition of the smoothing layer 5 the precursors have to be chosen such that they have a decomposition temperature which is lower or at least close to the temperature range indicated in Table 2. As a consequence, it may occur that for the growth of the smoothing layer 5 a different precursor is used or needs to be used than for the buffer layer 2.

FIG. 2 shows schematically another semiconductor heterostructure 11 according to another exemplary embodiment of the present invention. The semiconductor heterostructure 11 differentiates from the semiconductor heterostructure of FIG. 1 in that the smoothing layer 5 is grown directly on the relaxed layer 2. Regarding the properties of the support substrate 1, the buffer layer 2, the relaxed layer 3 and the layers of the multi-layer stack 21 of the semiconductor heterostructure 11, reference is made to the description of the corresponding layers in the semiconductor structure 10 of FIG. 1.

It should be note that the exemplary semiconductor heterostructures 10 and 111 of FIGS. 1 and 2 are only shown to demonstrate the basic principle of the present invention, namely to provide a multi-layer stack with ungraded layers which are strained layers, wherein the strained layers comprise at least one strained smoothing layer of a semiconductor material having in a relaxed state a third in-plane lattice parameter $a_3$ which is between the first and the second lattice parameter $a_1$, $a_2$ of the support substrate 1 and the buffer layer 2. The arrangement, the thickness and the number of layers in the multi-layer stack can vary in dependence on the respective embodiment of the invention.

The semiconductor heterostructure 11 has a similar low roughness at the surface 7 of its top layer 6 like the semiconductor heterostructure 10 of FIG. 1. Therefore, the semiconductor structure 10, 11 is very well suited for direct wafer bonding with a handle or receiving wafer for detachment of a useful layer from the semiconductor structure 10, 11 as described below.

FIG. 3 shows schematically the embodiment of FIG. 2 during an implantation step. In the example shown, an ion implantation is performed in the semiconductor heterostructure 11 through the layers of the multi-layer stack 21 down into the smoothing layer 5'. In other embodiments of the invention, another implantation depth can be chosen.

Implantation is achieved by implanting atomic species 12, like for example hydrogen ions or other inert gases, with a predetermined dose and energy. Due to the implantation a weakening area 13 is formed into the smoothing layer 5'. In another variant of the invention, the implantation conditions can be chosen such that the predetermined splitting or weakening area 13 is positioned in any one of the layers 5''', 5'', 5', 5; 4'''; 4''; 4' or at an interface between two of these layers. In any case, the weakening area 13 is positioned below the useful top layer 6 that will be transferred from the semiconductor heterostructure 10, 11 and above the strained layer 4 that will be used to help to reclaim the donor structure.

FIG. 4 shows schematically the embodiment of FIG. 3 after a bonding step with a handle wafer 14. Because of the very low surface roughness of the semiconductor heterostructure 11, it can be bonded directly at its surface 7 with the handle wafer 14 without difficulties or the necessity to planarize the surface 7 before bonding.

In another embodiment of the present invention, an insulator layer can be formed on the handle wafer 14 and/or on the inventive semiconductor heterostructure 10, 11 prior bonding. The insulator layer can be a native or grown insulator or can be formed by an oxidation of the handle wafer 14. Then, a thermal and/or mechanical treatment or another type of energy is applied on the implanted and bonded structure of FIG. 4 leading to a splitting of the structure along the predetermined weakening area 13. For example, the donor-handle compound of FIG. 4 is then placed into a furnace (not shown) and heated such that the predetermined splitting area 13 is fragilized which finally leads to a detachment of a remainder of the donor wafer 10, 11.

FIG. 5 shows schematically a split part of the embodiment of FIG. 4 after the splitting step. In the following, the non-useful layers 5"", 4'", 5'", 4", 5", 4', 5' of the multi-layer stack 21 are removed, preferably by etching. If the non-useful layers 5"", 4'", 5'", 4", 5", 4', 5' consist in general of one material such as SiGe, these layers can be removed in one etching step. If the non-useful layers 5"", 4'", 5'", 4", 5", 4', 5' consist of different material such as SiGe and strained silicon, several etching step have to be applied to remove these layers. Also, the remaining part of the layer(s) on the structure formed of the layers 1, 2, 3, 5 and, if present, 4 can be removed selectively with respect to etch stop strained layer 4. This allows to reclaim the donor wafer for preparation of a further donor substrate.

FIG. 6 shows schematically the embodiment of FIG. 5 after removal of the smoothing layers. The resulting structure consists of the handle wafer 14 and the useful layer 6 formed thereon.

The semiconductor heterostructures 10, 11 of the present invention are advantageously used in semiconductor devices, as improved electrical or optical properties can be achieved with the substrates having improved surface roughness properties.

What is claimed is:

1. A semiconductor heterostructure comprising:
   a support substrate with a first in-plane lattice parameter,
   a buffer structure formed on the support substrate and having on top in a relaxed state a second in-plane lattice parameter, and
   a multi-layer stack of ungraded layers formed on the buffer structure,
   wherein the ungraded layers are strained layers comprising at least one strained smoothing layer of a semiconductor material having in a relaxed state a third in-plane lattice parameter which has a value between that of the first and the second lattice parameters, and
   wherein the total thickness of the smoothing layer and all further layers that are not lattice matched with the buffer structure are less than a critical thickness to prevent nucleation of dislocations or other defects.

2. The semiconductor heterostructure of claim 1, wherein the buffer structure comprises an at least spatially graded buffer layer formed on the support substrate.

3. The semiconductor heterostructure of claim 2, wherein the buffer structure comprises a relaxed layer formed on the spatially graded buffer layer.

4. The semiconductor heterostructure of claim 3, wherein the spatially graded buffer layer is a spatially graded SiGe layer and the relaxed layer is a relaxed SiGe layer formed on the graded SiGe buffer layer and having a germanium content corresponding to the highest germanium content of the spatially graded SiGe buffer layer.

5. The semiconductor heterostructure of claim 4, wherein the multi-layer stack comprises a first strained silicon layer formed on the relaxed SiGe layer, wherein other layers of the multi-layer stack are formed on the first strained silicon layer.

6. The semiconductor heterostructure of claim 5, wherein the multi-layer stack comprises a first SiGe smoothing layer being formed on the first strained silicon layer, wherein the other layers of the multi-layer stack are formed on the first SiGe smoothing layer.

7. The semiconductor heterostructure of claim 4, wherein the multi-layer stack comprises a first SiGe smoothing layer being formed on the relaxed SiGe layer, wherein the other layers of the multi-layer stack are formed on the first SiGe smoothing layer.

8. The semiconductor heterostructure of claim 2, wherein the highest germanium content of the graded SiGe buffer layer is about 40%.

9. The semiconductor heterostructure of claim 1, wherein the buffer structure is a spatially graded SiGe buffer layer having an increasing germanium content, and the multi-layer stack includes alternating SiGe layers having a germanium content between 0% and a percentage that is less than the highest germanium content of the spatially graded SiGe buffer layer.

10. The semiconductor heterostructure of claim 9, wherein the multi-layer stack includes a plurality of alternating SiGe smoothing layers and strained silicon layers.

11. The semiconductor heterostructure of claim 10, wherein the highest germanium content of the graded SiGe buffer layer is about 20% and the SiGe smoothing layers have a germanium content of about 11 to about 19.5%.

12. The semiconductor heterostructure of claim 11, wherein each of the SiGe smoothing layers of the multi-layer stack has a thickness of about 200 Å to about 600 Å.

13. The semiconductor heterostructure of claim 11, wherein each of the strained silicon layers of the multi-layer stack has a thickness of about 50 Å to about 250 Å.

14. The semiconductor heterostructure of claim 11, wherein the multi-layer stack has a thickness of about 1000 Å to about 3400 Å.

15. The semiconductor heterostructure of claim 1, wherein the multi-layer stack includes a strained silicon layer as a top layer.

16. The semiconductor heterostructure of claim 1, wherein the support substrate comprises silicon, sapphire, SiC or AsGa, and the buffer structure is formed of an atomic alloy belonging to Group V-V, Group III-V, or Group II-VI.

17. The semiconductor heterostructure of claim 1, wherein the ungraded layers of the multi-layer stack comprise Si, Ge, SiGe, AsGa, InP, InGaAs, AlN, InN and/or GaN.

18. A semiconductor heterostructure comprising:
   a support substrate with a first in-plane lattice parameter,
   a buffer structure formed on the support substrate and having on top in a relaxed state a second in-plane lattice parameter, and
   a multi-layer stack of ungraded layers formed on the buffer structure,
   wherein the ungraded layers are strained layers comprising at least one strained smoothing layer of a semiconductor material having in a relaxed state a third in-plane lattice parameter which has a value between that of the first and the second lattice parameters, and
   wherein the multi-layer stack includes a plurality of alternating smoothing layers and strained layers with a top layer of the stack being a strained useful layer.

19. The semiconductor heterostructure of claim 18, wherein the smoothing layers are SiGe layers and the strained layers are strained silicon layers.

* * * * *

UNITED STATES PATENT AND TRADEMARK OFFICE
CERTIFICATE OF CORRECTION

PATENT NO.        : 7,544,976 B2                                            Page 1 of 1
APPLICATION NO.   : 11/672663
DATED             : June 9, 2009
INVENTOR(S)       : Aulnette et al.

It is certified that error appears in the above-identified patent and that said Letters Patent is hereby corrected as shown below:

Column 10:
Line 41 (claim 17, line 3), delete "AIN" and insert -- A1N --.

Signed and Sealed this

Fourteenth Day of July, 2009

JOHN DOLL
*Acting Director of the United States Patent and Trademark Office*